US012713537B2

(12) United States Patent
Richards

(10) Patent No.: US 12,713,537 B2
(45) Date of Patent: Aug. 18, 2026

(54) CIRCUIT BOARD MANUFACTURING METHOD

(71) Applicant: UFab Corporation, St. Louis, MO (US)

(72) Inventor: Tyler Richards, St. Louis, MO (US)

(73) Assignee: UFAB CORPORATION, St. Louis, MO (US)

(*) Notice: Subject to any disclaimer, the term of this patent is extended or adjusted under 35 U.S.C. 154(b) by 218 days.

(21) Appl. No.: 18/110,129

(22) Filed: Feb. 15, 2023

(65) Prior Publication Data

US 2024/0057260 A1 Feb. 15, 2024

Related U.S. Application Data

(60) Provisional application No. 63/397,654, filed on Aug. 12, 2022.

(51) Int. Cl.
*H05K 3/02* (2006.01)
*H05K 3/00* (2006.01)
(Continued)

(52) U.S. Cl.
CPC ......... *H05K 3/4038* (2013.01); *H05K 3/0047* (2013.01); *H05K 3/027* (2013.01);
(Continued)

(58) Field of Classification Search
CPC .. H05K 3/0047; H05K 2203/107; H05K 3/08; H05K 3/4038; H05K 3/027;
(Continued)

(56) References Cited

U.S. PATENT DOCUMENTS 5,315,072 A * 5/1994 Arai ................. H05K 2203/107 174/250
6,310,701 B1 10/2001 Lizotte
(Continued)

FOREIGN PATENT DOCUMENTS

JP 2015128106 A * 7/2015

OTHER PUBLICATIONS

Kiani et al, "A new method to interconnect PCB layers in GHz frequency range," 2000 Proceedings. 50th Electronic Components and Technology Conference (Cat. No.00CH37070), Las Vegas, NV, USA, 2000, pp. 432-438. (Year: 2000).*
(Continued)

*Primary Examiner* — A. Dexter Tugbang
(74) *Attorney, Agent, or Firm* — Carroll, Hoette & Butscher, LLC; Christopher R. Carroll

(57) ABSTRACT

A method of manufacturing circuit boards includes affixing a conductive material to a base material to form a board media. The method may include cutting one or more vias in the board media in a user-selected arrangement. The method may further include cutting one or more traces in the conductive material to form a user-selected pattern of the one or more traces. The one or more traces may be surrounded by a moat area on the board media. The method may include cutting a high temperature material in the user-selected pattern. The method may include applying the high temperature material to the board material.

15 Claims, 8 Drawing Sheets

(51) Int. Cl.
*H05K 3/08* (2006.01)
*H05K 3/40* (2006.01)
*H05K 1/11* (2006.01)

(52) U.S. Cl.
CPC ............... *H05K 3/08* (2013.01); *H05K 1/115* (2013.01); *H05K 2203/107* (2013.01); *Y10T 29/49155* (2015.01); *Y10T 29/49165* (2015.01)

(58) Field of Classification Search
CPC ................. H05K 1/115; H05K 3/0038; Y10T 29/49155; Y10T 29/49165
See application file for complete search history.

(56) References Cited

U.S. PATENT DOCUMENTS 10,104,771 B1 * 10/2018 Ho ......................... H05K 3/027
2005/0205524 A1 * 9/2005 Lee ......................... H05K 3/027 216/91
2007/0251929 A1 11/2007 Sukhman et al.
2009/0074987 A1 * 3/2009 Auyeung ......... H05K 2203/107 427/596
2014/0167500 A1 * 6/2014 Frankenberger ............................. Y10T 29/49155 29/846
2014/0175705 A1 * 6/2014 Morita ............. H05K 2203/107 264/400
2015/0027754 A1 1/2015 Shimoda et al.
2016/0174364 A1 6/2016 Harkness, Jr. et al.
2016/0262271 A1 * 9/2016 Nazarenko ....... H05K 2203/107
2022/0168847 A1 * 6/2022 Kleinert ............... H05K 3/0038

OTHER PUBLICATIONS

LPKF Laser & Electronics AG, "Multipurpose Tool for the Electronics Lab", LPKF AG, 10055030-011121-EN, LPKF ProtoLaser U4, downloaded Dec. 10, 2023 (2 pages).

LPKF Laser & Electronics, "LPKF TechGuide" LPKF SE, www.lpkf.com/distributor, 10065850-051222-EN, downloaded Dec. 10, 2023 In-House PCB Prototyping (44 pages).

LPKF Laser & Electronics, "ProtoLaser U4", www.lpkf.com/en/industries-technologies/research-in-house-pcb-prototyping/producs/lpkf-protolaser-u4, printed Dec. 10, 2023 (7 pages).

LPKF Laser & Electronics, "In-House Rapid PCB Prototyping", Product Catalog, www.lpkf.com/distributor, downloaded Dec. 10, 2023 (64 pages).

International Search Report and Written Opinion for PCT/US23/71769 mailed Feb. 21, 2024 (17 pages).

LPKF Laser & Electronics, "In-House Rapid PCB", Product Catalog, 2024, LPKF SE, 10005769-220824-EN, https://product-showroom-dq.lpkf.com (62 pages).

LPKF Laser & Electronics, "LPKF TechGuide, In-House PCB Prototyping" 2024, LPKF SE, 10065850-051222-EN, www.lpkf.com/distributor (46 pages).

Indiegogo, "ComMarker B4 Laser Engraver: 10X Faster & Deeper" (12 pages).

LPKF USA, "LPKF: PCB Prototype Technology/Laser Material Processing" (8 pages).

RP Photonics Encyclopedia, "Q-switched lasers" (13 pages).

LPKF Laser & Electronics, "LPKF CircuitPro" Basic Manual, May 9, 2012 (111 pages).

Barth "A Miniaturized Uniplanar Metamaterial-Based EBG for Parallel-Plate Switching Noise Suppression" IEEE, Department of Electrical and Computer Engineering University of Alberta, AP-S 2015 (2 pages).

LPKF Laser & Electronics, "LPKF CircuitPro PM" https://app.lpkfusa.com/products/pcb_prototyping/software/circuitpro_pm/ (2 pages).

LPKF Laser & Electronics, "Fabrication of a PCB-embedded Half-Bridge Module" https://app.lpkfusa.com/products/pcb_prototyping/white_papers/fabrication_of_a_pcb-embedded_half-bridge_module/ (2 pages).

LPKF Laser & Electronics, "Fast Prototyping of Flexible PCBs Using LPKF ProtoLaser" https://app.lpkfusa.com/products/pcb_prototyping/white_papers/fast_prototyping_of_flexible_pcbs_using_lpkf_protolaser/ (2 pages).

LPKF Laser & Electronics, "Processing Rogers Bonding Materials with LPKF Prototyping Equipment" https://app.lpkfusa.com/products/pcb_prototyping/white_papers/processing_rogers_bonding_materials_with_lpkf_prototyping_equipment/ (3 pages).

LPKF Laser & Electronics, "Structuring & Cutting LTCC Carbon Tape on LPKF ProtoLaser R" 3. https://app.lpkfusa.com/products/pcb_prototyping/white_papers/structuring_cuflon_on_lpkf_protolaser_r/ (2 pages).

International Preliminary Report on Patentability for PCT/US23/71769 mailed Feb. 27, 2025 (9 pages).

* cited by examiner

CIRCUIT BOARD MANUFACTURING METHOD

CROSS-REFERENCE TO RELATED APPLICATIONS

This application claims priority to U.S. Provisional Patent Application No. 63/397,654 (filed 12 Aug. 2022), the entire disclosure of which is incorporated by reference.

BACKGROUND

Technical Field

The subject matter described herein generally relates to manufacturing circuit boards.

Discussion of Art

A circuit board electrically connects and/or mechanically fixes predetermined electronic components. While large scale production of circuit boards may be a fast process, producing prototypes or "one-off" circuit boards may be an expensive and time-intensive process. The slow production times and high costs may result in inordinately high development costs, both in terms of parts and labor. It may take weeks, if not months, between the factory receiving the request for the initial design of the circuit board and the user receiving the final circuit board. Additionally, if any modifications are needed by the user or if the circuit board is not satisfactory in any way, this long process may need to start over at the design stage.

Industrial fabrication facilities also may use large quantities of noxious chemicals in the production process that may be environmentally harmful, as well as dangerous to workers making the circuit boards.

It may be desirable to have a system and method that differs from those that are currently available.

BRIEF DESCRIPTION

In accordance with one example or aspect, a system may include one or more movable arms, a via cutting tool, a trace cutting tool, and a controller. The via cutting tool may be removably coupled to the one or more movable arms. The via cutting tool may cut one or more vias in a board material to form a user-selected arrangement of the one or more vias. The trace cutting tool may be removably coupled to the one or more movable arms. The trace cutting tool may cut one or more traces in the board material to form a user-selected pattern of the one or more traces in the board material. The controller may control movement of the one or more movable arms relative to the board material to form a user-customizable circuit board in the board material. The user-customizable circuit board may include the user-selected arrangement of the one or more vias and the user-selected pattern of the one or more traces in the board material.

In accordance with one example or aspect, a method of manufacturing circuit boards may include affixing a conductive material to a base material to form a board media. The method may include cutting one or more vias in the board media in a user-selected arrangement. The method may further include cutting one or more traces in the conductive material to form a user-selected pattern of the one or more traces. The one or more traces may be surrounded by a moat area on the board media. The method may include cutting a high temperature material in the user-selected pattern. The method may include applying the high temperature material to the board material.

In accordance with one example or aspect, a circuit board including a board media, a user-selected pattern, and a high temperature material. The board media may be formed from a base material covered by a conductive material. The conductive material may include the user-selected pattern such that the user-selected pattern may have a non-conductive moat surrounding the conductive material. The high temperature material may include the user-selected pattern. The high temperature material may be coupled to the board media over the conductive material. The user-selected pattern of the conductive material may be exposed through the high temperature material.

BRIEF DESCRIPTION OF THE DRAWINGS

The subject matter may be understood from reading the following description of non-limiting embodiments, with reference to the attached drawings, wherein below:

FIG. 2 is a front view of one example of board material;

DETAILED DESCRIPTION

Embodiments of the subject matter described herein relate systems and methods of making circuit boards. It may be advantageous to have individuals, small companies, development teams, and others to have more control over design and production of circuit boards. This may reduce the cost and time input associated with production of a customizable circuit board, provide a more personalized product, provide a more accurate and consistent product, may reduce environmental impacts, and may reduce negative health impacts otherwise associated with the manufacture of circuit boards by other known techniques.

The present subject matter may relate to a method or system of manufacturing circuit boards by affixing a conductive material to a base material to form a board media and using a machine to drill and cut vias and/or traces, respectively, in the board media based on a user-selected arrangement or pattern. Optionally, the traces may be formed in another way, such as using focused energy (e.g., lasers). The forming of vias and/or traces may be performed by the same machine or by different machines. By providing the user the ability to manufacture their own circuit board, this may reduce the manufacturing time, reduce manufacturing cost, enable more customization, and/or benefit innovators and engineers around the world when compared to some known large scale circuit board manufacturing techniques.

Figure 1:
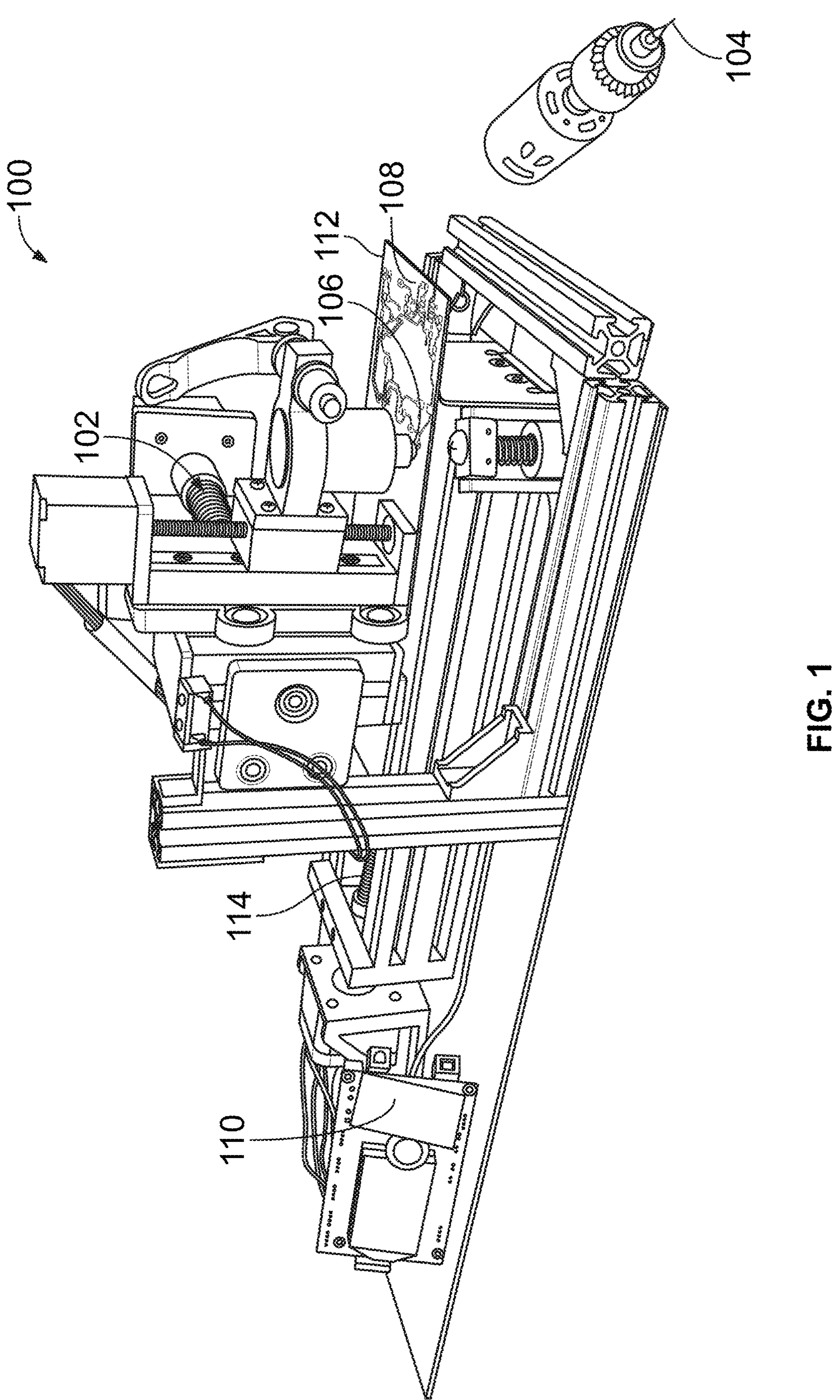
FIG. 1 is a perspective view of one example of a manufacturing system for creating or building a circuit board, according to one example.

FIG. 1 illustrates one example of a manufacturing system or machine 100 for building or creating a circuit board. The manufacturing system includes one or more moveable arms 102, a via cutting tool 104, a trace forming or cutting tool 106, and a controller 110. The system may use the via cutting tool and the trace forming tool to create a customizable circuit board on or using the board material.

The arm may be moveably mounted to the machine such that the arm may be able up, down, left, right, backward, forward, and any combination thereof. The arm may include or be coupled with one or more motors capable of moving the arm in one or more directions. The motor may be a direct current (DC) drive motor, alternating (AC) drive motor, a servo motor, a stepper motor, or the like. Additionally, the arm may be in communication with the controller such that the controller may direct movement of the arm. The arm may include a coupling portion, such as a drill chuck, a clamp, a press fit, a quarter-turn lock, a snap fit, or the like. The coupling portion may allow a tool, such as the via forming tool, to be coupled to the arm. The tools can be interchanged with the coupling portion, such as the via forming tool may be removed and the trace forming tool may be coupled to the coupling portion of the arm.

The controller of the system may include one or more processors (e.g., microprocessors, microcontrollers, field programmable gate arrays, integrated circuits, or other logic devices) that operate based on instructions stored on a tangible and non-transitory computer readable storage medium, such as software applications stored on a memory, and/or that are hardwired to circuitry of the controller. The controller may store or access information such as circuit schematics, computer aided design (CAD) files, Gerber files or equivalents, GCODE files or any equivalent computer numerical control (CNC) programming language, and the like. The controller may control movement of the moveable arms relative to the board material. The controller may communicate the store information to the system and the movable arm.

Figure 2:
FIG. 2 is a cross-sectional view of one example of board material.
Figure 2:
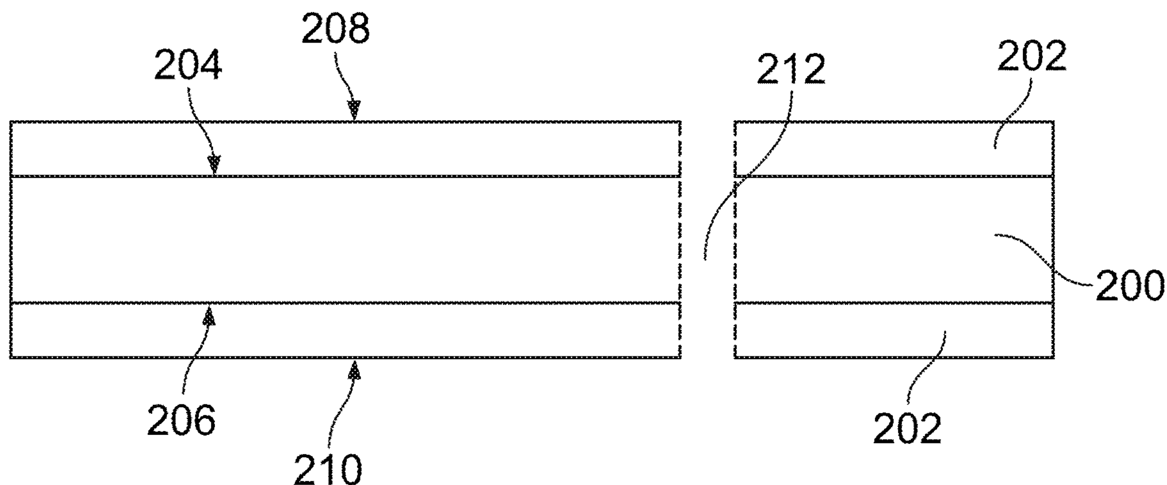

FIG. 2 illustrates a cross-sectional view of one example of board material 108. The board material may be the starting or stock material from which the circuit boards are made using the systems and methods described herein. The board material may include a non-conductive or sufficiently insulated base material 200. For example, the base material may be formed from an insulative or dielectric material that, without more, may not conduct electronic signals or energy. The base material may include a composite material made of resin and fiberglass that may give the board strength as well as flexibility. In one example, the base material may be an insulated aluminum. Insulated aluminum may be advantageous in scenarios where high heat dissipation is preferred. The user may select a different base material based on the desired finished product. The base material may be rigid, flexible, or a combination of rigid and flexible, depending on user preference. The board material is formed when the base material is covered with an exterior conductive material, layer, film, or coating 202 on one side 204 or both of opposite sides 204, 206 of the base material. In one example the conductive material may be copper and may be affixed to the base material with an adhesive. Optionally, the conductive material shown in FIG. 2 may represent conductive tape, such as copper tape. The conductive material may include aluminum, iron, or the like. The conductive material may be heat-set to the base material. This board material may be the blank canvas for which any number of customized circuit boards may be created.

As one example, the board material can represent or be formed from copper clad that includes one, two, or more thin conductive sheets (e.g., copper) bonded to an insulative (e.g., fiberglass resin layer, such as FR4) using an adhesive (e.g., epoxy). As another example, the board material can represent or be formed from conductive tape (e.g., copper tape, which may be one to 3.15 mils or another thickness) bonded to the base material. This can allow for the possibility of flexible, recyclable, metal, and other circuit boards without the typical high costs involved in creation of the boards. Additionally, because of the method of etching described herein, more delicate materials, such as plastics, can be made from a color that prevents overheating or other damage during the etching process (as described below).

The system may manufacture a single-sided circuit board in which the board has components mounted on only one side 208 or 210 of the board. Double sided circuit boards may also be produced in which both sides 208, 210 of one board may include components. Multi-layered circuit boards may be produced in which multiple boards may have connected components, and the multiple boards are coupled together to form one multi-layered circuit board.

The via cutting tool may cut one or more holes 212 in the board material to form a user-selected arrangement of the holes. One or more of these holes may be through holes that extend entirely through the board material or may extend part of the way, but not entirely through the entire thickness, of the board material. The user-selected arrangement may be performed by software tools, such as CAD. The user may enter the desired design including the overall electrical components, routes, number of boards, and board size. In one example, the via cutting tool may include a mechanical device that mechanically forms the through holes by physical contact between the via forming tool and the board material. This device may include a drill, a mill, or the like. In the example illustrated in FIG. 1, the via cutting tool may be coupled to the moveable arm of the system. The via cutting tool may be coupled to the moveable arm during a first time period to cut through holes in the board material. In another embodiment, the via cutting tool may be coupled to a first movable arm. The via cutting tool may be removably coupled to the first movable arm or may be permanently coupled to the first movable arm.

The trace forming tool may cut one or more traces in the board material to form a user-selected pattern of traces in the board material. These traces may be formed between two or more of the vias and/or other areas of the board material to form conductive pathways between the vias, between traces, and/or between components that will be added to the board material later on in the manufacturing process. Again, the user-selected pattern may be implemented using a software tool, such as CAD. In one example, the trace forming tool may be a cutting tool that includes a blade, a knife, a drill, a milling tool, or other cutting implement. This tool may mechanically cut the conductive material on the board material. For example, the tool may cut the conductive material 202 on one or both sides of the base material to remove the conductive material 202 and form the conductive traces. The conductive traces may be formed by the conductive material that is left between areas where the conductive material is cut away. The excess conductive material may be removed, leaving the user-selected pattern as the traces for electrical connectivity. Removing the conductive material creates electrically disconnected regions or moats on the board material. This step may be repeated for multiple layer circuit boards. The multiple layers may be electrically connected through the vias cut in each board.

In the example illustrated in FIG. 1, the trace forming tool may be coupled to the moveable arm of the system. The trace forming tool may be coupled to the moveable arm during a second time period to cut traces in the board material. The second time period may be different then the first time period. For example, the first time period may be before the second time period and the second time period may directly follow the first time period. In one example, the user may remove the via cutting tool and attach the trace forming tool. In another example, discussed in detail below, the via cutting tool and the trace forming tool may be changed autonomously. Stated differently, the via cutting tool can be removed and the trace forming tool can be attached absent direct user interaction. The controller may direct the autonomous changing of the tools. In another embodiment, the trace forming tool may be coupled to a second movable arm. The trace forming tool may be removably coupled to the second movable arm or may be permanently coupled to the second movable arm.

The board material may be placed under the movable arm. In one embodiment, the system may include the mounting board or work surface 112 to hold or contain the board material. In one example, the mounting board may be a platform or a spoil board. The system may include a carriage or sled 114 (which may be one or more of the conveyors described above) that may place the board material under the movable arm. In example, the mounting board may include a moveable belt or platform that may move the board material under the arm. The board material may also be manually placed under the arm by user interaction. The carriage may include a self-aligning mechanism to center the board material under the movable arm. The via cutting tool may be coupled to the movable arm. The controller may communicate to the movable arm a particular user-selected arrangement of the vias. With the via cutting tool coupled to the arm, the controller may direct the movable arm to cut or drill the user-selected arrangement of the vias in the board material.

Figure 3:
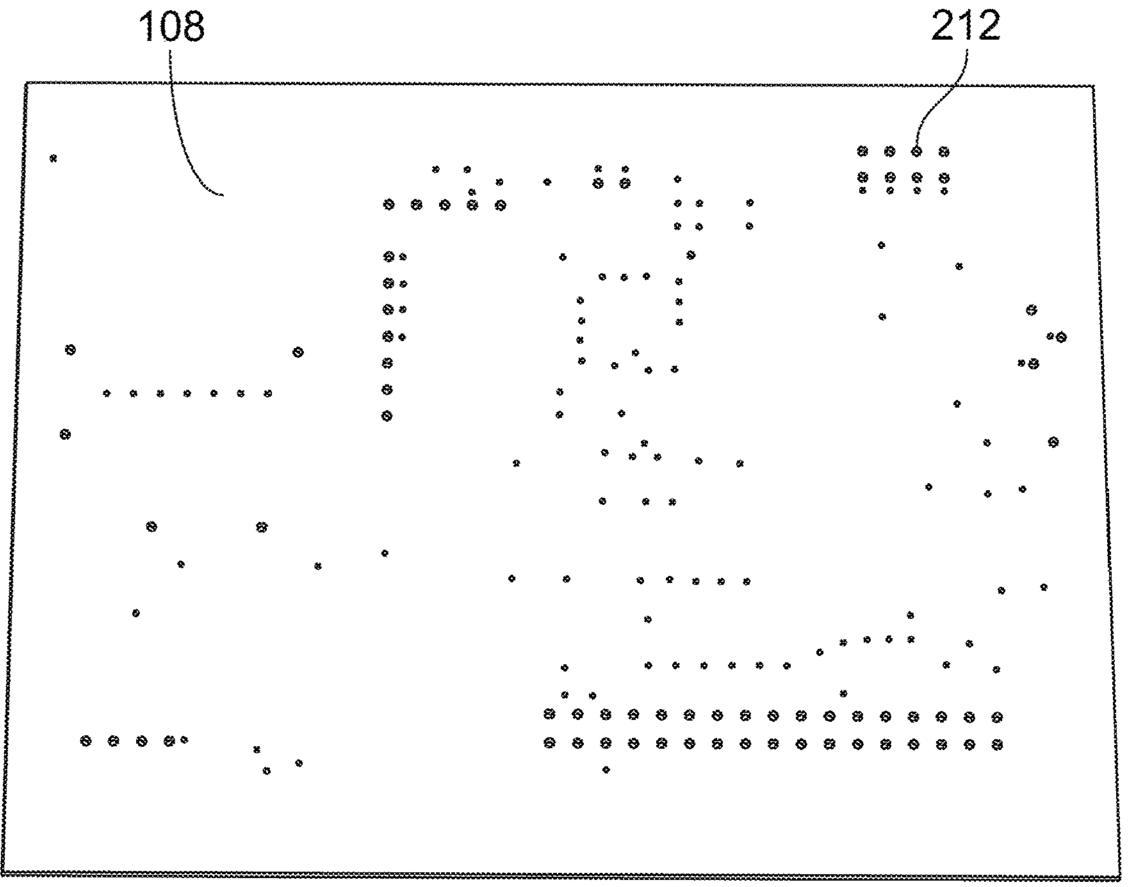
FIG. 3 is a front view of another example of board material.

As illustrated in FIG. 3, this may result in the board material 108 with a series of through holes 212 that may be filled with conductive material to form conductive vias extending through the board material. In one example, the board material may then be ready for the electrical traces to be cut or otherwise formed in or on one or more sides 208, 210 of the board material. However, in examples where multiple boards may be used, the additional boards may be placed on the mounting board for the same series of vias to be cut or drilled. Once the one or more board materials are drilled, the board materials may then have the electrical traces cut, as discussed below. The via cutting tool may then be removed from the movable arm and the trace forming tool may be coupled to the movable arm for cutting electrically disconnection regions or moats in the conductive material to form conductive traces in the board, as described below. Optionally, the traces may be formed using laser light, also as described below.

Figure 4:
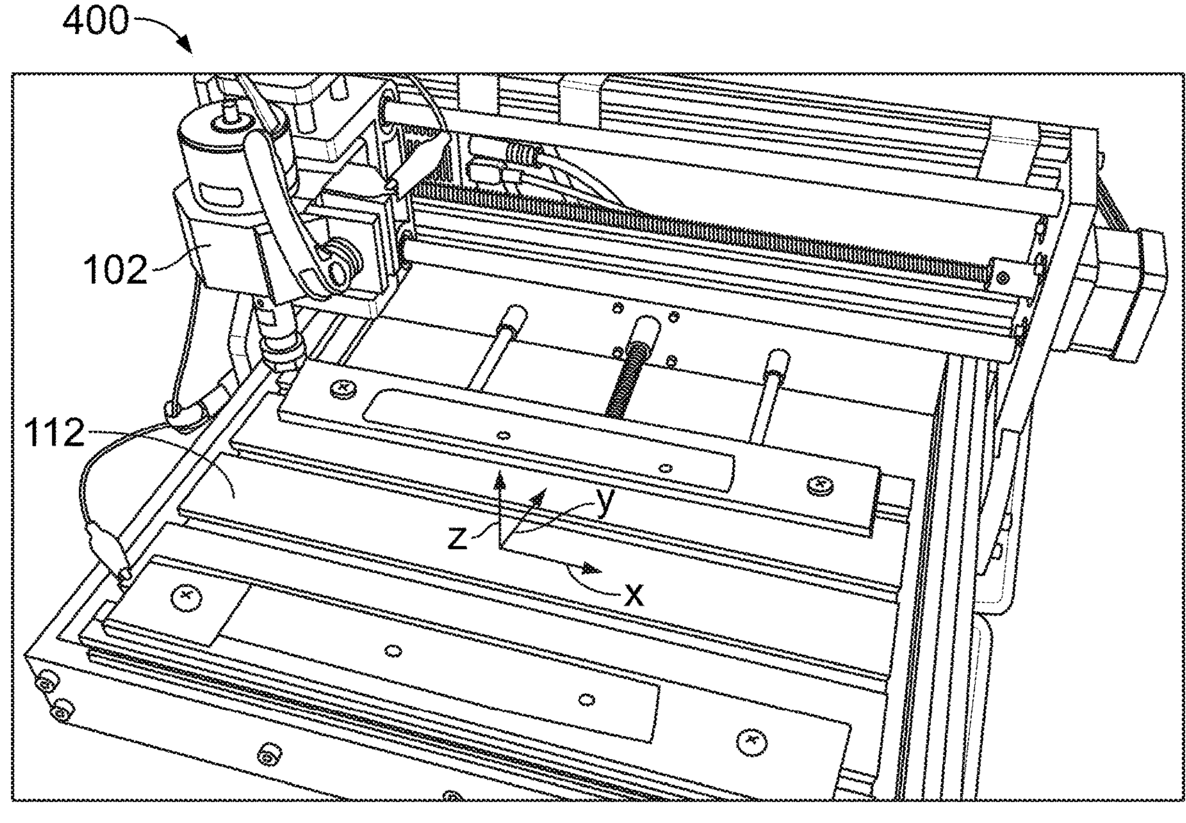
FIG. 4 is a perspective view of one example of a manufacturing system for creating or building a circuit board, according to one example.
Figure 5:
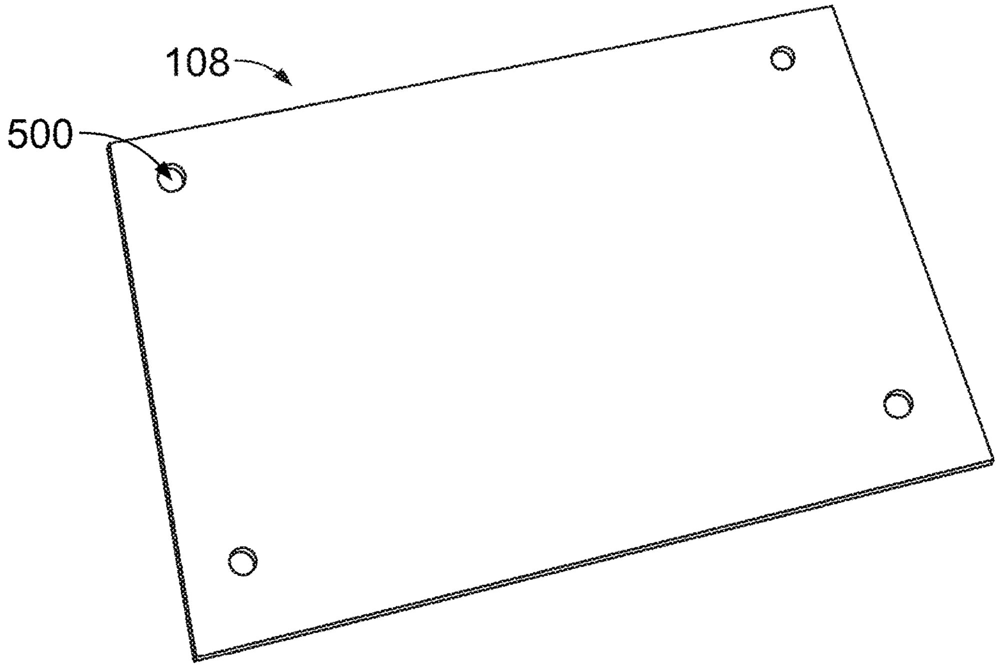
FIG. 5 is a perspective view of another example of board material.
Figure 6:
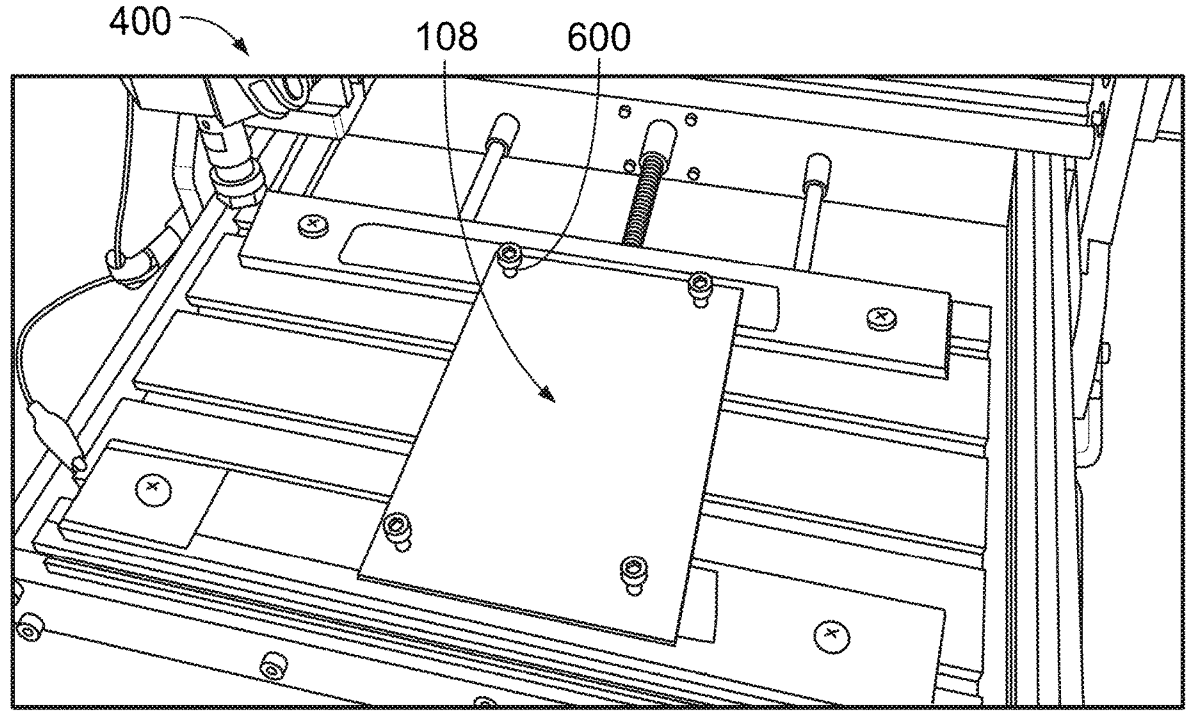
FIG. 6 is a system for alignment and mounting of a board, according to one example.

FIG. 4 illustrates another example of a via cutting assembly 400 that moves the via cutting tool to cut the through holes through the board material. FIG. 5 illustrates one example of the board material prior to cutting through holes through the board material. FIG. 6 illustrates the board material on or in the via cutting tool. The via cutting assembly may include the mounting board or work surface 112 on which the board material may be placed. This work surface can include alignment features or bodies 600 (shown in FIG. 6) upwardly protruding from the work surface. These features or bodies may be fasteners (e.g., screws or bolts), posts, pins, blocks, or the like. As shown in FIG. 5, the board material can include alignment receptacles 500 (e.g., through holes) through which the alignment features of the via cutting tool extend (as shown in FIG. 6). This can help with aligning the board material with the via cutting tool (e.g., the drill or drill tip, such as the one shown in FIG. 1) that cuts the through holes.

The via cutting assembly may include conveyors 102, such as the moveable arms, that can hold and move the via cutting tool relative to the board material. These moveable arms or conveyors can include or represent shafts (threaded or unthreaded) along which the arm holding the via cutting tool moves, belts that move the arm holding the via cutting tool, or a combination of the like. The conveyors may include motors that move or translate the via cutting tool along different directions, such as a left-and-right direction (e.g., in opposite directions along an x-axis that is parallel to the surface of the board material that faces the via cutting tool) and an up-and-down direction (e.g., in opposite directions along a y-axis that is perpendicular to the x-axis and that also is parallel to the surface of the board material that faces the via cutting tool) so that the via cutting tool can be moved above the board material in a two-dimensional plane parallel to the surface of the board material to position the via cutting tool in the locations where the through holes are to be cut. The conveyors also may lower the via cutting tool to and through the board material to form the through holes (e.g., along or in a direction that is opposite a z-axis that is perpendicular to the x-axis, the y-axis, and the surface of the board material that faces the via cutting tool). Optionally, one or more of the conveyors may move the board material instead of or in addition to moving the via cutting tool.

The via cutting assembly and/or tool can cut the through holes in the desired or directed locations through the board material. The board material with the through holes may then receive conductive material into the through holes to form the vias (e.g., conductive pathways that vertically extend through the thickness of the board material, or that extend in a thickness direction of the board material that is oriented perpendicular to the opposite surfaces 208, 210 of the board material. For example, the through holes formed by the via cutting tool may be filled with a conductive material. This can be achieved by melting solder paste or high temperature metal paste into the through holes, inserting conductive epoxy into the through holes, using metal (e.g., copper) plating techniques (e.g., electroplating, electroless plating, etc.), or the like.

In one example, the system can form conductive traces in the board material by the controller communicating a particular user-selected pattern for the traces in the board material with the movable arm(s). The controller may then direct the trace cutting tool coupled to the movable arm to cut the user-selected pattern of traces on the board material. For example, if the controller is to form a conductive trace from one via to another via (or to another trace, a conductive pad 332 to which a component will be mounted to the board, etc.), then the trace forming tool may cut portions of the conductive material 202 on opposite sides of the path where the trace will extend. This can remove the conductive material outside of or along an outer boundary of the trace, thereby forming the trace with the conductive material that remains.

A user-customizable circuit board may be created from the user-selected arrangement of vias and the user-selected pattern of traces in the board material. Where there are one or more boards being used, the boards may then be coupled together to form the multi-board arrangement with the appropriate vias and traces formed. The boards may be coupled with glue, in one example. In one example, the machine may then test the board material to ensure the electrical connections and traces are functioning as expected.

Figure 7:
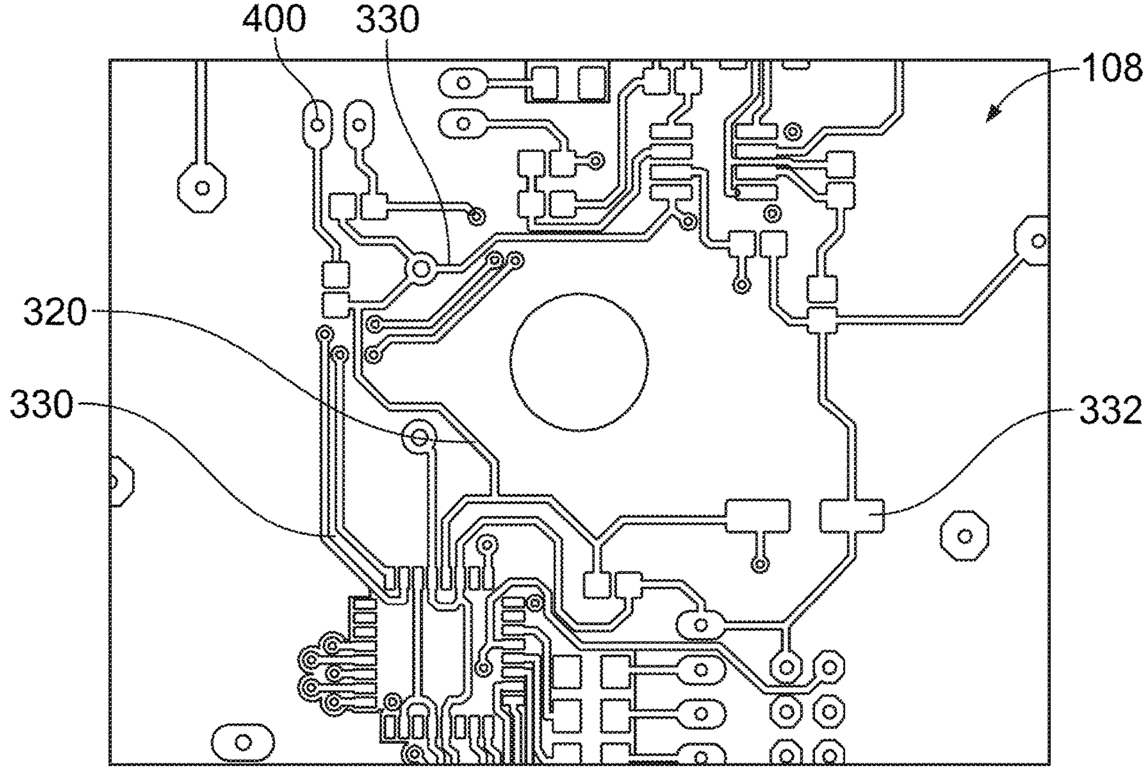
FIG. 7 is a front view of example of board material with traces, vias, and other features.

As illustrated in FIG. 7, the board material 108 may be shown once the through holes have been cut (and filled with conductive material to form vias 400), and the traces 320 formed by cutting away excess conductive material in electrically disconnected areas or moats 330. The excess conductive material may be removed, leaving the user-selected pattern as the traces for electrical connectivity. Removing the conductive material creates the electrically disconnected regions or moats 330 on the board material, with the traces disposed between or bounded by these regions or moats. This can create the conductive traces without involving photolithography, etching, or the like, which can be time-consuming and/or involve potential exposure to dangerous chemicals. An additional step, discussed below, may follow in which the board material and the components thereof may be labeled for ease of identification.

Optionally, the traces may be formed without or in addition to the mechanical cutting away of the conductive material on the base material using a blade or sharp edge. For example and as described below, laser light may be directed onto the conductive material on one or more sides of the base material to etch, ablate, or otherwise remove portions of the conductive material. These portions can be removed to form the electrically disconnection regions or moats, thereby also forming the conductive traces.

Figure 8:
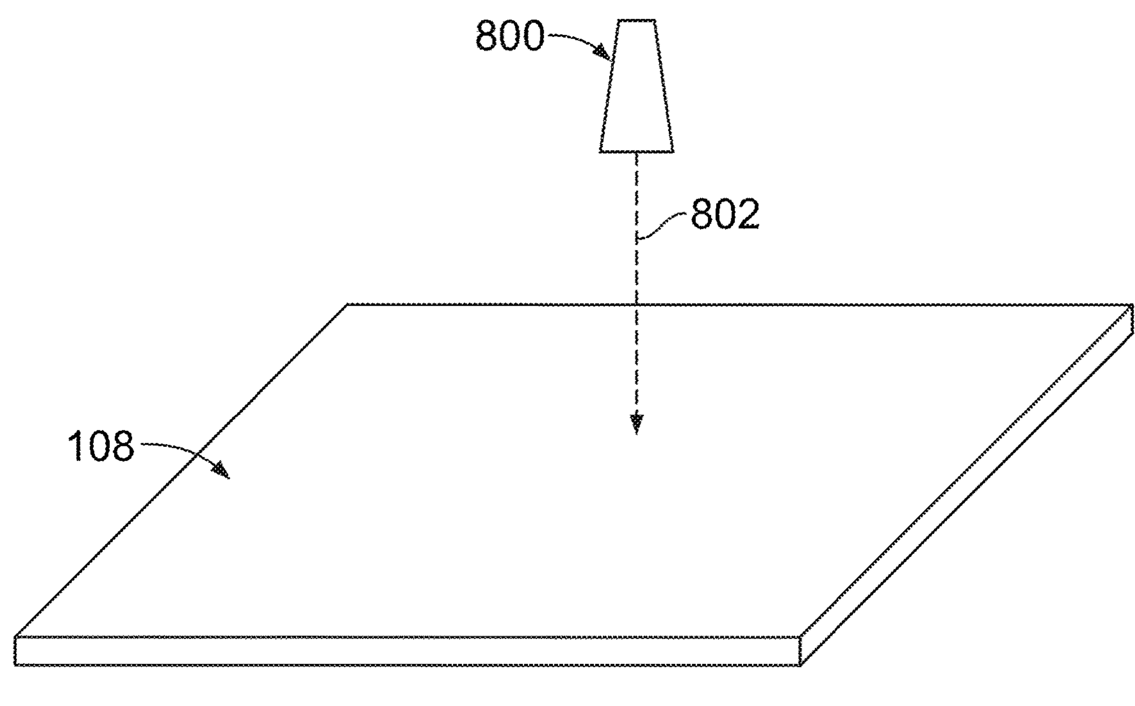
FIG. 8 is a schematic view of another example of a manufacturing system for creating or building a circuit board.

FIG. 8 schematically illustrates one example of a trace forming tool 800. The trace forming tool can be used to form the conductive traces in the board material. In one embodiment, the controller directs the trace forming tool to create the traces in the board material by removing the conductive material in the electrically disconnected regions or moats without mechanically or physically contacting or cutting the conductive material of the board material, without applying any chemicals (e.g., photolithography chemicals or etchants) to the board material, without submerging the board material in any chemicals, etc.

The trace forming tool may include or represent an energy source that directs energy 802 onto or toward the surface 208 and/or 210 of the board material to remove portions of the conductive material on the surface 208, 210. Removal of these portions forms the moats or electrically disconnected areas, thereby leaving conductive traces between the electrically disconnected areas or moats. The energy source may represent a laser light source that directs focused light (e.g., a laser) onto the board material to ablate, etch, or otherwise remove desired or selected portions of the conductive material on the base material of the board material. In one example, the trace forming tool includes a Q-switched laser that produces short, high-energy pulses of laser light. Such a laser source may buildup lower levels of energy (e.g., in one or more crystals or other devices), and then discharge or release this buildup energy. This can allow for much higher peak power to be achieved relative to other types of lasers, such as continuous wave lasers. Additionally, because the laser light can be applied in very precise ways, use of the laser to remove the conductive material and form the traces can provide for increased accuracy and/or finer details in the circuitry formed on and/or in the board material. The use of laser light to ablate the conductive material and form the pads and/or traces may allow for different types of materials to be used as the base material of the board that would be otherwise unable to be used in a mechanical or industrial manufacturing process. For example, lighter, plastic, flexible, etc. materials may be used (instead of fiberglass board). To prevent damage to the more delicate possible materials from the laser during etching, the bulk materials can be given a color that reflects more of the laser energy, preventing them from burning, melting, or other damage that could arise from the laser coming into contact with the bulk material. Additionally, the bulk materials can be made partially or completely transparent or translucent, allowing laser light to pass through the bulk material rather than being absorbed by the bulk material, preventing damage to the bulk material.

The trace forming tool optionally can form one or more conductive pads by cutting or ablating the conductive material on one or both sides of the base material. These pads may be two-dimensional conductive areas to which conductive contacts or pads of electronic components may be mounted. These components can include processors, graphics cards, ribbons, capacitors, resistors, inductors, etc. The conductive traces can be formed to interconnect different combinations of the vias, pads, other traces, etc. to form a circuit board.

Figure 9:
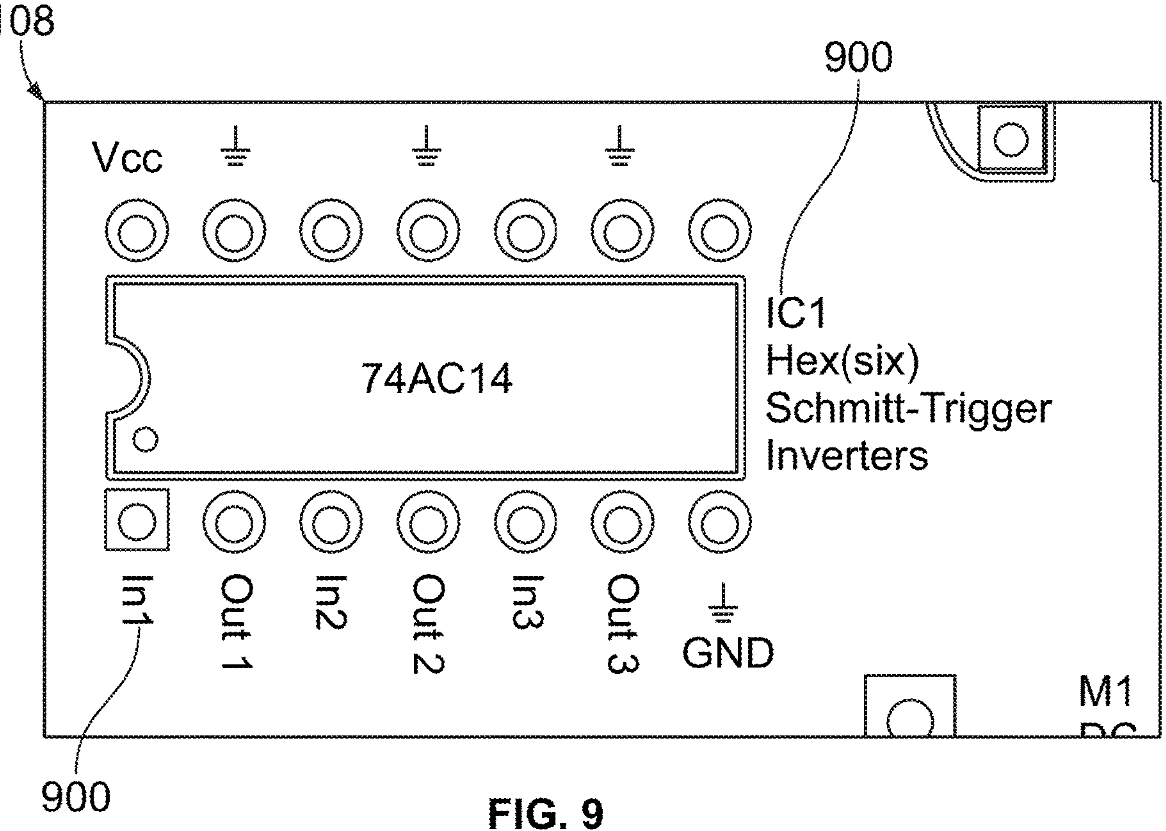
FIG. 9 is a front view of indicia that could be added to a board.

Once the vias, pads, and/or conductive traces are formed, markings may be formed on the board material. In one example, a marker may be removably coupled to the movable arms. As shown in FIG. 9, the marker may apply indicia 900 on the board material to identify the vias, traces, and/or other components of the circuit board. These indicia may be drawn on the conductive material that was not removed by the trace forming tool. The indicia may also be drawn on the high temperature materials covering the conductive materials. In one example, the marker may be coupled to the movable arm during a third time period. The third time period may be different then the first time period and the second time period. For example, the third time period may be after the first and second time periods, such that the marker is able to indicate the vias cut during the first time period, as well as the traces formed during the second time period. In one example, the user may remove the via cutting tool or the trace forming tool and attach the marker. In another example, discussed below, the via cutting tool, the trace forming tool, and the marker may be changed autonomously. For example, the via cutting tool or the trace forming tool can be removed and the marker can be attached absent direct user interaction. The controller may direct the autonomous changing of the tools. In one example, the marker may be coupled to a third movable arm. The marker may be removably coupled to the third movable arm or may be permanently coupled to the third movable arm.

In another example, silkscreen can be placed directly onto the conductive material or onto a covering layer formed from a nonconductive material positioned over or outside of the conductive material (e.g., Kapton), as described below. A marker or pen can then be used to print the indicia on either the conductive or nonconductive material itself. Optionally, the nonconductive material (e.g., Kapton) can be exposed to the energy (e.g., a laser) to etch or form the indicia in the nonconductive material. Some of this energy may pass through the nonconductive material and etch or mark the underlying conductive material. This can make the indicia formed by the silkscreen or other ink more resistant to water, alcohol, fluxes, or other cleaning materials for circuit boards.

Once the vias, pads, and/or traces have been formed and applicable markings optionally applied, the result may be a functional circuit board. The functional circuit board may be the shape of the initial board material used. In one example, the machine may further include a board cutting tool. The board cutting tool may be coupled to the movable arm. In one example, the user may remove the via cutting tool, the trace cutting tool, or the marker and may attach the board cutting tool. In another example, discussed below, the board cutting tool, the via cutting tool, the trace forming tool, and/or the marker may be changed autonomously. The board cutting tool may be an end mill, drill, a blade, or the like. The board cutting tool may cut the functional circuit board into a customizable shape. This may allow the user to choose what shape the finished circuit board is based on a desired use case. For example, it may be advantageous to have a triangular, circular, rectangular, square, hexagonal, or irregularly shaped circuit board. Optionally, the via cutting tool may cut several through holes around the perimeter of the circuit board to be formed. The circuit board may then be separated from the rest of the board material (similar to cutting along perforated lines). The shapes listed are meant by way of example and are not intended to limit the shapes that the board cutting tool may produce. The controller may direct the board cutting tool to cut the circuit board according to a user selected input.

Figure 10:
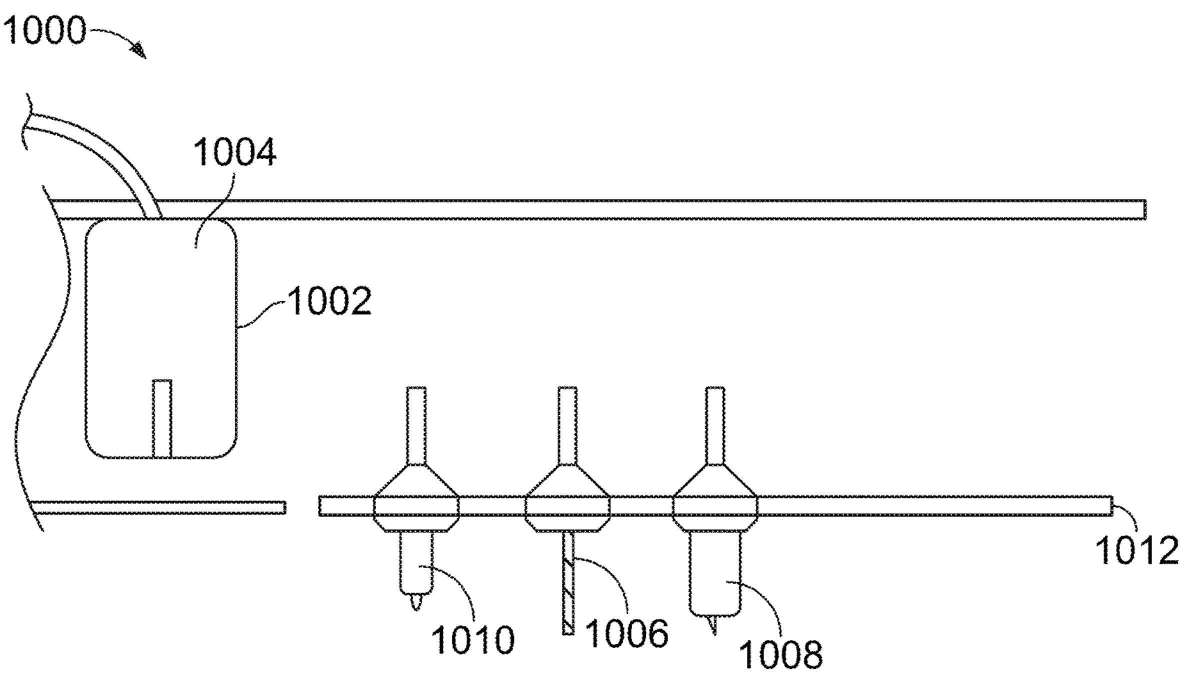
FIG. 10 is a schematic view of another example of a manufacturing system for creating or building a circuit board.

FIG. 10 illustrates one example of a machine 1000 for manufacturing a circuit board including an automatic tool changer 1002. The machine may include an arm 1004 for removably coupling one or more tools. In one example, the automatic tool changer may be a part of the arm. In another example, the automatic tool changer may be separate from the arm. In one example, the tools may include a via cutting tool 1006, a trace forming tool 1008, and a marker 1010. The tools may be changed autonomously by the automatic tool changer. The automatic tool changer may be a drum type changer, a chain type changer, linear type changer, or the like. The automatic tool changer may include one or more gripper arms, and a tool magazine or rack 1012. The automatic tool changer may be coupled to the machine and may be positioned substantially within the machine or adjacent to the machine. The automatic tool changer may receive an instruction from a controller that the via cutting tool needs to be exchanged for the trace cutting tool, for example. In one example, the arm of the machine may be able to position itself above a rack of tools and retrieve a tool from the rack via a locking system. Once the tool is no longer needed or a new tool is required, the arm may return to the rack to deposit the tool in its original location, leaving the arm free to position itself above and pick up another tool. This process may be repeated for any desired tool removal and placement. The automatic tool changer may allow the machine to operate more efficiently and with less user required input.

Figure 11:
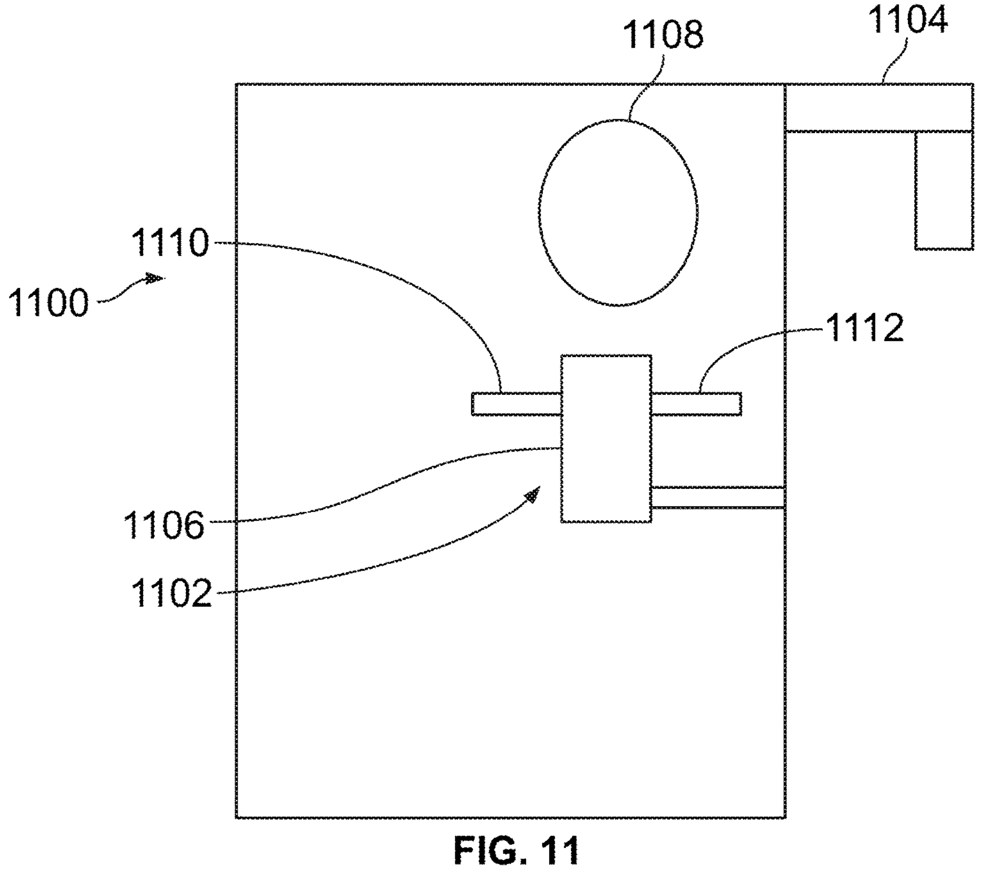
FIG. 11 is a schematic view of another example of a manufacturing system for creating or building a circuit board.

FIG. 11 illustrates another example of a machine 1100 for manufacturing a circuit board including an automatic tool changer 1102. The machine may include an arm 1104 for removably coupling tools, such as a via cutting tool, a trace cutting tool, and a marker. The automatic tool changer may be a drum type changer, a chain type changer, or the like. The automatic tool changer may include one or more gripper arms, a base 1106, and a tool magazine 1108. The automatic tool changer may be coupled to the machine and may be positioned substantially within the machine or adjacent to the machine. The automatic tool changer may receive an instruction from a controller that the via cutting tool needs to be exchanged for the trace forming tool, for example. The automatic tool changer may then get into position for a first gripper arm 1110 to remove the via cutting tool from the arm. A second gripper arm 1112 may retrieve the trace cutting tool from the tool magazine. The automatic tool changer may then rotate such that the second gripper arm with the trace cutting tool is positioned to attach the trace cutting tool into the arm. The first gripper arm may then place the via cutting tool into the tool magazine for storage. This process may be repeated for any desired tool removal and placement. The automatic tool changer may allow the machine to operate more efficiently and with less user required input.

The automatic tool changer may include surface-mount technology (SMT) or pick-and-place machinery. The automatic tool changer may include verification imaging devices, for example high resolution cameras, to verify where on the movable arm the previous tool needs to be removed, as well as where on the movable arm the current tool needs to be placed. The machine may have an adjustment system, such as a high precision linear encoders, to remove and place the tools with a high degree of accuracy. In one example, the tools may include an identifier that may be readable by the verification imaging device to confirm which tool is being removed/placed and the location of removal/placement. The identifier may be a reflective marker, a quick response (QR) code, a near field communication (NFC) tag, image recognition, or the like.

Figure 12:
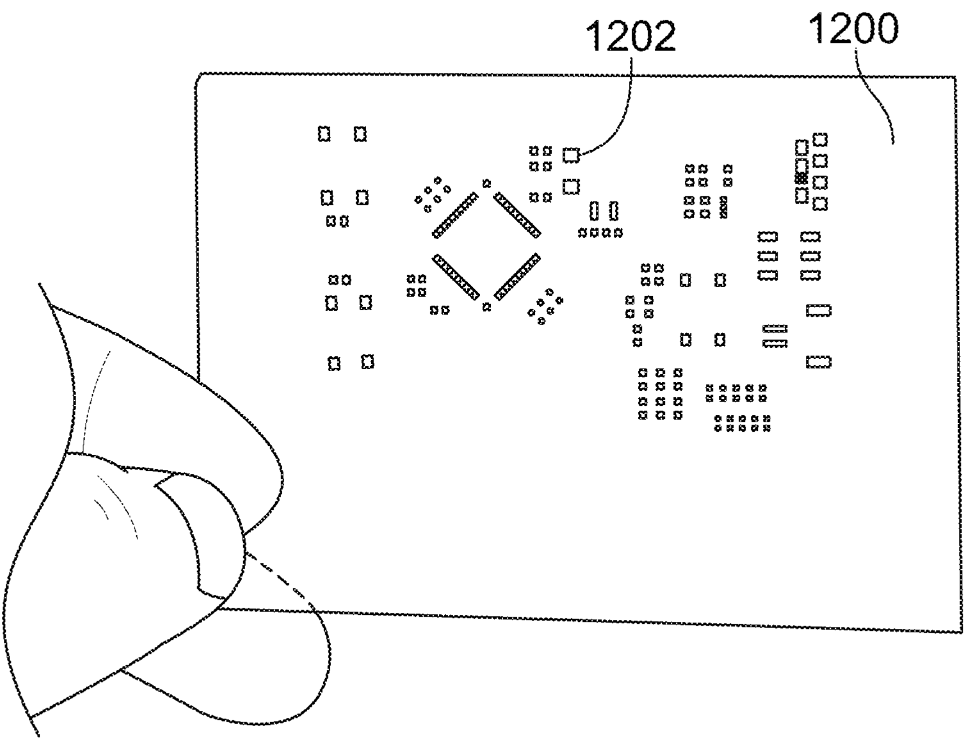
FIG. 12 is a front view of high temperature material, according to one example.
Figure 13:
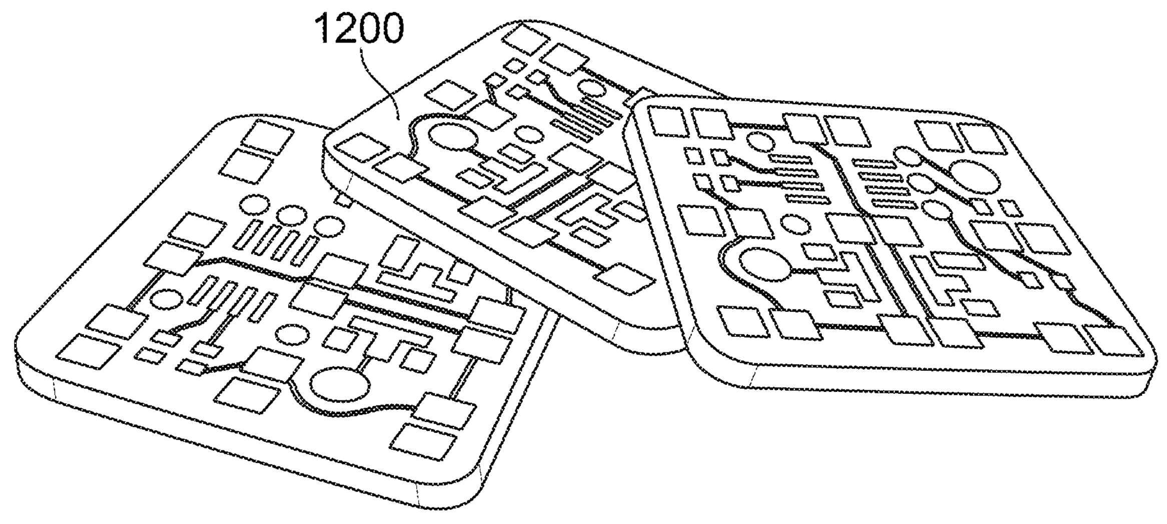
FIG. 13 is a schematic view of another example of a circuit board.

FIG. 12 illustrates one example of a covering layer 1200 that may be applied to one or more sides 208, 210 of the board material once the pads, traces, and/or vias are formed in or one the board material. In one example, the covering layer may be or may include a high temperature material, tape, or the like, can be applied to the board material to act as a solder mask and/or protective layer. The covering layer may be a thin layer of material, such as a polymer, that may protect the conductive material on the circuit board from oxidation and shorts during operation, and may act as a solder mask. The covering layer may include Teflon, Polytetrafluoroethylene (PTFE), Kapton, or the like. In one example, the covering layer may be formed from a resin material that may be harden by exposure to ultraviolet light. The covering layer may additionally protect the circuit board from environmental factors, such as dust, debris, and other contaminants that may impact the function of the circuit board. The covering layer may be placed under the movable arm when the trace forming tool is coupled. As shown in FIG. 12, the trace forming tool may cut or ablate a user-selected pattern into the covering layer. This may produce the same pattern on the covering layer as on the board material. Through holes 1202 in the covering layer may act as exposed solder pads. FIG. 13 illustrates one example of the covering layer shown in FIG. 12 applied to one or more sides 208, 210 of the board material. The covering layer may be attached to the board material. The covering layer may be attached manually by the user or may be attached using a self-aligning mechanism or fiducial markers. This process may be repeated for double layer boards or multilayer boards. The user-selected pattern of the covering layer may align with the user-selected pattern of the board material, such that the traces, pads, and/or vias may be exposed through the through holes in the covering layer.

Once the covering layer is affixed to the board material, solder paste or a conductive epoxy can be placed onto the pads, into the through holes to form the vias, or the like, to conductively connect different layers of the circuit board and/or to attach components to the circuit board. Conductive epoxy may set or cure either through temperature or time, while the solder paste may be melted inside the hole to form an electrical link between the layers of the circuit board. To possibly prevent the solder paste from leaking out of the via or hole and damaging an electrical contact, the paste may be placed inside the via or hole, then covered with the covering layer to form a tight seal that may prevent the paste from leaking out during heating.

Optionally, instead of or in addition to marking the conductive material of the board material, the trace forming tool may use the laser to mark the covering layer on the board material. One or more operational settings of the laser may be changed from the settings used to form the conductive traces. These changed settings may result in the laser discoloring or otherwise changing an appearance of portions of the covering layer without ablating, etching, or removing the covering layer. These settings can include changing a pulse frequency (e.g., decreasing a frequency) of the pulses of laser light or otherwise reducing a power of the laser light. The pulse frequency may be the frequency at which the laser light is generated and directed at the board material. For example, the energy source may build up energy over time and then direct pulses of the light at a pulse frequency (e.g., forty kHz or another value). The pulse frequency and the frequency of the laser light may differ from each other. For example, the pulse frequency may be at or around forty kHz while the frequency of the laser light may be over two hundred and eighty terahertz. Different materials may react differently to different pulse frequencies of light. For example, the conductive material (e.g., copper) on the base material of the board material may absorb more laser light and reflect less laser light at a first pulse frequency, but the covering layer may absorb less light and reflect more laser light at a lesser, second pulse frequency. The first pulse frequency of light can be used to form the traces and/or pads, and the second pulse frequency of light can be used to discolor or otherwise mark the covering layer without removing the covering layer or damaging any underlying layers. This can cause the indica to be formed on the covering layer using the laser light. Alternatively, the lasers output power can be altered to interact with different materials. For example, a high output power can be used to oblate conductive material and form traces, while a lower output power can be used to discolor or otherwise mark the covering layer without removing the covering layer or damaging any underlying layers.

The laser light also may be used to remove undesirable materials from one or more areas of the circuit board. For example, the laser light emitted by the trace forming tool may be directed to exposed areas of the conductive material (e.g., the pads, traces, etc.) by removing or ablating areas of the covering material over the conductive material. Additionally, the laser light can be utilized to remove oxidized areas of the conductive material, improving the areas solderability. Additionally, one or more solvents (e.g., water, isopropyl alcohol, etc.) can be applied to remove carbonization of the conductive material caused by the laser ablation.

Figure 14:
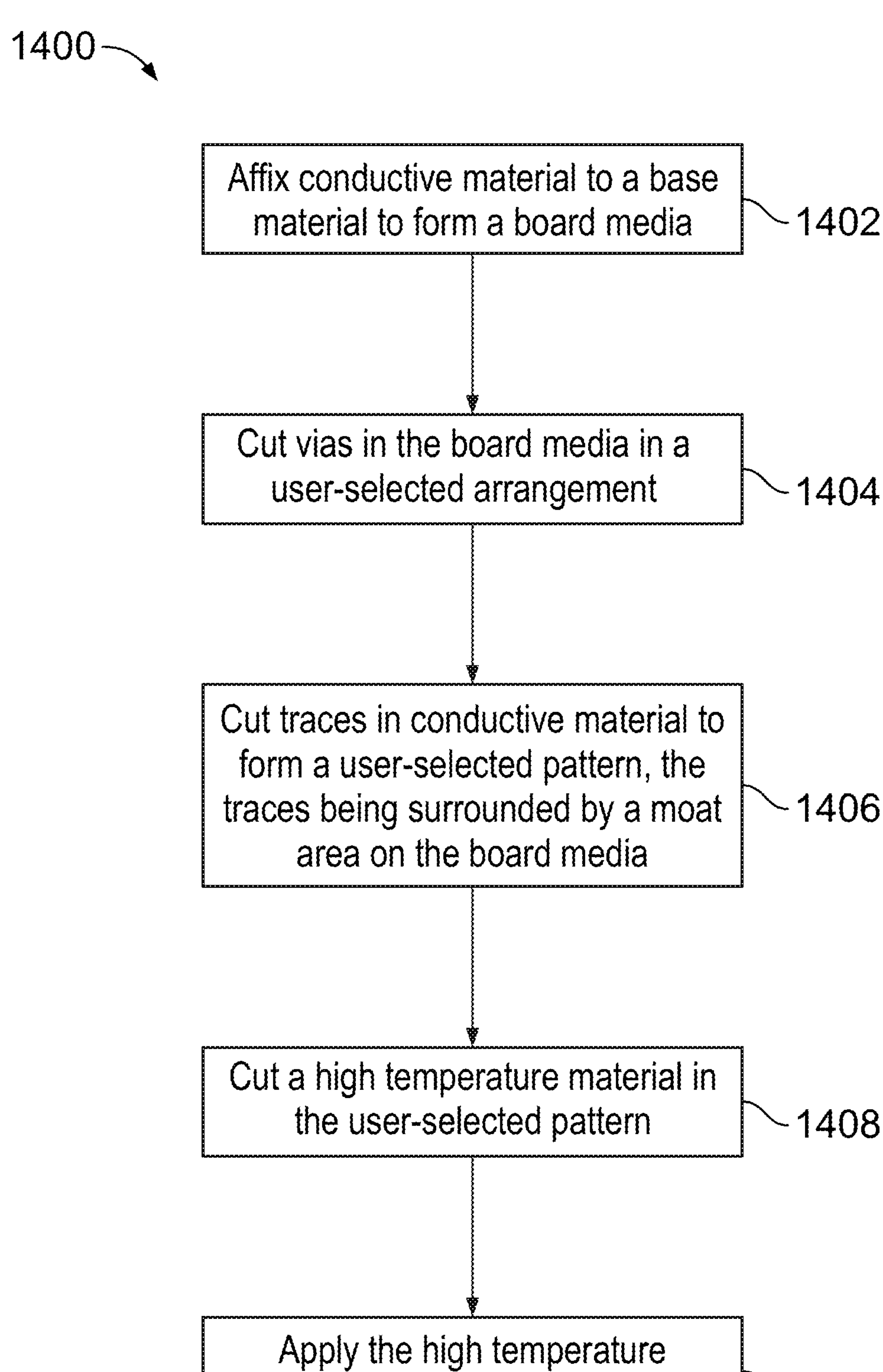
FIG. 14 is a flow chart of one example of a method of manufacturing a circuit board.

FIG. 14 illustrates one example of a method 1400 of manufacturing circuit boards. At 1402, the method may include affixing a conductive material to a base material to form a board material. The board material may include a composite material made of resin and fiberglass. This may provide the board with a strength and flexibility that may be desirable. The conductive material may be copper, aluminum, iron, or the like. At 1404, the method may cut one or more through holes in the board media in a user-selected arrangement. The user may input a desired arrangement into a software program that may include circuit schematics, CAD files, Gerber files or equivalents, GCODE files or any equivalent computer numerical control (CNC) programming language, and the like. At 1406, the method may form one or more traces in the conductive material to form a user-selected pattern of the traces. The traces may be surrounded by a moat area on the board media. The traces may be formed by cutting away areas of the conductive material or laser ablating or etching areas of the conductive material. At 1408, the method may cut the covering layer in the user-selected pattern. The covering layer may be a high temperature tape or another material. At 1410, the method may include applying the covering layer to the board media. The covering layer may act as a solder mask. The covering layer may protect the conductive material on the circuit board from oxidation and shorts during operation. The covering layer may additionally protect the circuit board from environmental factors, such as dust, debris, and other contaminants that may impact the function of the circuit board.

In one example, the machine for manufacturing the circuit board may be intended as a consumer machine. This machine may be a desktop circuit board printer that allows individual consumers to design, customize, manufacture, and print circuit boards in a home or office environment. The consumer machine may be compact and suitable for at home use. In another example, the machine for manufacturing the circuit board may be a professional machine. The professional machine may be larger and may include more components than the consumer machine. The professional machine may make circuit boards more rapidly than the consumer machine. The consumer machine may be able to produce a large quantity of customized or customizable circuit boards that may then be sold to individual consumers.

Use of phrases such as "one or more of . . . and," "one or more of . . . or," "at least one of . . . and," and "at least one of . . . or" are meant to encompass including only a single one of the items used in connection with the phrase, at least one of each one of the items used in connection with the phrase, or multiple ones of any or each of the items used in connection with the phrase. For example, "one or more of A, B, and C," "one or more of A, B, or C," "at least one of A, B, and C," and "at least one of A, B, or C" each can mean (1) at least one A, (2) at least one B, (3) at least one C, (4) at least one A and at least one B, (5) at least one A, at least one B, and at least one C, (6) at least one B and at least one C, or (7) at least one A and at least one C.

As used herein, an element or step recited in the singular and proceeded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following clauses, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

The above description is illustrative, and not restrictive. For example, the above-described embodiments (and/or aspects thereof) may be used in combination with each other. In addition, many modifications may be made to adapt a particular situation or material to the teachings of the subject matter without departing from its scope. While the dimensions and types of materials described herein define the parameters of the subject matter, they are exemplary embodiments. Other embodiments will be apparent to one of ordinary skill in the art upon reviewing the above description. The scope of the subject matter should, therefore, be determined with reference to the appended claims, along with the full scope of equivalents to which such clauses are entitled.

This written description uses examples to disclose several embodiments of the subject matter, including the best mode, and to enable one of ordinary skill in the art to practice the embodiments of subject matter, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A method for forming a circuit board, the method comprising:
- drilling one or more holes into a board material having an interior dielectric layer and at least one exterior conductive layer;
- forming one or more vias by inserting a conductive material into the one or more holes;
- forming one or more conductive traces or conductive pads by laser ablating the at least one exterior conductive layer around the one or more conductive traces or conductive pads using a laser;
- applying a covering layer to at least one side of the board material to form a solder mask;
- marking, with the laser, the covering layer to form indicia on the covering layer; and
- removing oxidation from the at least one exterior conductive layer by exposing the at least one exterior conductive layer to laser light from the laser.

2. The method of claim 1, further comprising:
- applying the covering layer to the at least one exterior conductive layer, the covering layer having one or more openings corresponding with at least one of the one or more conductive pads.

3. The method of claim 1, wherein the one or more vias and the one or more conductive traces or conductive pads are formed without using photolithography and without using chemical etching.

4. The method of claim 1, wherein the indicia is formed to label and identify the one or more conductive traces or conductive pads.

5. The method of claim 1, wherein the laser is a Q-switched laser configured to produce high-energy pulses of laser light.

6. A method for forming a circuit board, the method comprising:
- drilling one or more holes into a board material having an interior dielectric layer and at least one exterior conductive layer;
- forming one or more vias by inserting a conductive material into the one or more holes and without using photolithography and without using chemical etching;
- forming one or more conductive traces and one or more conductive pads by laser ablating the at least one exterior conductive layer around the one or more conductive traces using a Q-switched laser;
- applying a covering layer to the at least one exterior conductive layer to form a solder mask, the covering layer applied to have one or more openings corresponding with at least one of the one or more conductive pads;
- removing oxidation from the at least one exterior conductive layer by exposing the at least one exterior conductive layer to laser light from the Q-switched laser; and
- marking, with the Q-switched laser, the covering layer to form indicia on the covering layer.

7. The method of claim 6, wherein the indicia label and identify the one or more conductive traces or conductive pads.

8. The method of claim 6, wherein drilling the one or more holes is performed using a computer-controlled drill bit under control of a controller.

9. The method of claim 6, wherein inserting the conductive material into the one or more holes comprises filling the one or more holes with solder paste or conductive epoxy.

10. The method of claim 6, wherein the covering layer comprises a high temperature polytetrafluoroethylene (PTFE) polymer film.

11. The method of claim 6, wherein marking the covering layer comprises adjusting a pulse frequency or output power of the Q-switched laser to discolor the covering layer without ablating or removing the covering layer.

12. The method of claim 6, further comprising cutting the board material to a user-selected shape.

13. The method of claim 6, wherein forming the one or more conductive traces comprises laser ablating the at least one exterior conductive layer to define electrically disconnected moats surrounding each of the one or more conductive traces.

14. The method of claim 6, further comprising applying solder paste or conductive epoxy to the one or more openings in the covering layer for subsequent component mounting.

15. The method of claim 6, wherein removing oxidation from the at least one exterior conductive layer by exposing the at least one exterior conductive layer to laser light prior to forming the one or more conductive traces and the one or more conductive pads.

* * * * *